US009929035B2

(12) United States Patent
Bodner et al.

(10) Patent No.: US 9,929,035 B2
(45) Date of Patent: Mar. 27, 2018

(54) METHOD OF PRODUCING A REMOVABLE WAFER CONNECTION AND CARRIER FOR WAFER SUPPORT

(71) Applicant: ams AG, Unterpremstaetten (AT)

(72) Inventors: Thomas Bodner, Seiersberg (AT); Joerg Siegert, Graz (AT); Martin Schrems, Eggersdorf (AT)

(73) Assignee: ams AG, Unterpremstaetten (AT)

( * ) Notice: Subject to any disclaimer, the term of this patent is extended or adjusted under 35 U.S.C. 154(b) by 286 days.

(21) Appl. No.: 14/654,471

(22) PCT Filed: Dec. 19, 2013

(86) PCT No.: PCT/EP2013/077434
§ 371 (c)(1),
(2) Date: Jun. 19, 2015

(87) PCT Pub. No.: WO2014/096215
PCT Pub. Date: Jun. 26, 2014

(65) Prior Publication Data
US 2015/0348817 A1    Dec. 3, 2015

(30) Foreign Application Priority Data

Dec. 21, 2012  (EP) ..................................... 12199124

(51) Int. Cl.
*H01L 21/683*  (2006.01)
(52) U.S. Cl.
CPC .. *H01L 21/6835* (2013.01); *H01L 2221/6834* (2013.01); *H01L 2221/68318* (2013.01);
(Continued)
(58) Field of Classification Search
CPC ............. H01L 21/6835; H01L 21/6836; H01L 2221/68304; H01L 2221/68318; H01L 2221/68327; Y10T 156/1111
See application file for complete search history.

(56) References Cited

U.S. PATENT DOCUMENTS 6,821,376 B1 * 11/2004 Rayssac ............ H01L 21/67092
156/382
2003/0032294 A1   2/2003 Gardes
(Continued)

FOREIGN PATENT DOCUMENTS

DE    10055763 A1    5/2002
DE    10156465 C1    7/2003
(Continued)

OTHER PUBLICATIONS

Bassous, E., "Bonding Together Surfaces Coated With Silicon Dioxide", IBM Technical Dislosure Bulletin, International Business Machines Corp., vol. 19, No. 7, Dec. 1, 1976, p. 2777/2778, XP002131952, ISSN: 0018-8689.

*Primary Examiner* — Carson Gross
(74) *Attorney, Agent, or Firm* — McDermott Will & Emery LLP

(57) ABSTRACT

A relief structure is formed on a surface of a carrier provided for accommodating a wafer, which is fastened to the carrier by a removable adhesive contacting the carrier. The relief structure, which may be spatially confined to the center of the carrier, reduces the strength of adhesion between the wafer and the carrier. If the adhesive is appropriately selected and maintains the connection between the wafer and the carrier at elevated temperatures, further process steps can be performed at temperatures of typically 300° C. or more. The subsequent mechanical separation of the adhesive joint is facilitated by the relief structure on the carrier.

4 Claims, 4 Drawing Sheets

(52) U.S. Cl.
CPC ............ *H01L 2221/68327* (2013.01); *H01L 2221/68381* (2013.01); *Y10T 156/10* (2015.01); *Y10T 156/1111* (2015.01)

(56) References Cited

U.S. PATENT DOCUMENTS

| | | |
|---|---|---|
| 2005/0173064 A1 | 8/2005 | Miyanari |
| 2007/0062644 A1* | 3/2007 | Nakamura .......... B29C 63/0013 156/703 |
| 2009/0159208 A1 | 6/2009 | Kirby |
| 2009/0218560 A1 | 9/2009 | Flaim et al. |

FOREIGN PATENT DOCUMENTS

| | | |
|---|---|---|
| EP | 1605503 A2 | 12/2005 |
| JP | 2000271863 A | 10/2000 |
| JP | 2007149884 A | 6/2007 |
| WO | 03/094224 A1 | 11/2003 |

* cited by examiner

METHOD OF PRODUCING A REMOVABLE WAFER CONNECTION AND CARRIER FOR WAFER SUPPORT

BACKGROUND OF THE INVENTION

Semiconductor wafers having a thickness of less than 250 μm are particularly suitable for the formation of chip stacks in three-dimensional integration. During manufacture a thin semiconductor wafer is fastened to a carrier or handling wafer, which may be a thick semiconductor wafer. The handling wafer mechanically stabilizes the thin wafer to facilitate further process steps and is afterwards removed.

US 2005/0173064 A1 describes a method wherein a semiconductor wafer is mounted to a perforated carrier plate serving as a carrier. An adhesive layer is used to fasten the wafer. After the wafer has been thinned, the adhesive is dissolved with a solvent, which is introduced into the openings of the carrier plate. In this method the adhesive may be exposed to process chemicals that can adversely affect the bond stability. The handling of perforated carrier wafers requires tools like specially designed end effectors and involves a potential cross contamination risk.

WO 03/094224 A1 describes a method for producing a substrate. A layer is formed on a temporary support with a fragile bond created in the vicinity of the interface. The layer is then selectively and locally etched, and a second layer is bonded to cover the etched zones and to form essentially closed cavities distributed over the substrate. By the application of constraints the first layer is separated from its temporary support at the fragile bond.

US 2009/0218560 A1 describes methods for reversibly mounting a device wafer to a carrier by forming edge bonds, which are chemically and thermally resistant, but can also be softened, dissolved or mechanically disrupted to allow the wafers to be separated with very low forces and at or near room temperature at the appropriate stage in the fabrication process.

DE 101 56 465 C1 describes a method of producing a wafer arrangement including a bond connection. A wafer is provided with recesses in its first and second main surfaces in such a manner that the recesses penetrate the wafer. A high-temperature stable, detachable connection is formed between the wafer and a further wafer by means of a dielectric interlayer.

DE 100 55 763 A1 describes a method of producing a wafer connection. A wafer is provided with a liquid layer of alcohols and polymerized silicic acid molecules partially substituted by organic residues. The alcohols are partially vaporized to form a semi-solid sticky layer, which is joined to a further wafer. A heat treatment yields a high-temperature stable, removable connection between the wafers.

ZoneBond™, commercially available from Brewer Science Inc., provides temporary bonding and debonding at room temperature. The bonding is effected by an adhesive, which is removed by a solvent. Only a low separation force is required because the adhesive strength is reduced in the centre by a chemical modification of the carrier surface. At temperatures above ca. 350° C. the zone of reduced adhesion is destroyed and the wafer cannot be separated from the carrier any more.

SUMMARY OF THE INVENTION

Zones of different adhesion strengths are created on a carrier by a spatially confined and suitably patterned relief structure without chemical modification of the surface.

In one aspect the invention relates to a method of producing a removable wafer connection, which comprises the steps of forming a relief structure on a surface of a carrier provided for accommodating a wafer, and fastening the wafer to the carrier by a removable adhesive contacting the carrier. The relief structure reduces the strength of adhesion between the wafer and the carrier, as compared to the application of an adhesive layer on the entire planar contact surface of a conventional carrier. The relief structure avoids the necessity of a further modification of the carrier surface, in particular by a chemical method.

In a variant of the method a margin of the surface of the carrier is kept free from the relief structure.

In a further variant of the method the relief structure is formed by a recess or a plurality of recesses in the surface of the carrier.

In a further variant of the method the relief structure comprises a further recess or a plurality of further recesses in the surface of the carrier, the recess or each recess of the plurality of recesses having a larger volume than the further recess or any further recess of the plurality of further recesses.

In a further variant of the method only the further recess or each recess of the plurality of further recesses is completely filled with the adhesive.

In a further variant of the method the recess or each recess of the plurality of recesses has a first depth, and the further recess or each recess of the plurality of further recesses has a second depth that is different from the first depth.

In a further variant of the method the relief structure is formed by at least one recess that is confined in a plane of the surface of the carrier by concentric circles or spirals.

A further variant of the method further comprises the steps of selecting the adhesive to provide a stable connection between the wafer and the carrier at a temperature of at least 300° C. and to be removable after having been exposed to such a high temperature, performing at least one further process step at this elevated temperature or reaching this temperature while the wafer is still connected to the carrier, and subsequently removing the adhesive by introducing a solvent between the wafer and the carrier. The removal of the adhesive may take place at a lower temperature, especially at room temperature, for example. In a further aspect the invention relates to a carrier for wafer support, especially a carrier that is provided for an application in one of the above variants of the method. The carrier has a surface provided for accommodating a wafer and a relief structure reducing an area of the surface that is provided for an application of an adhesive.

In an embodiment of the carrier, a margin of the carrier is free from the relief structure.

In a further embodiment the carrier has a reduced thickness in the margin.

In a further embodiment of the carrier the relief structure comprises a recess that does not penetrate the carrier or a plurality of recesses that do not penetrate the carrier.

In a further embodiment the relief structure comprises a further recess or a plurality of further recesses, the recess or each recess of the plurality of recesses having a larger volume than the further recess or any further recess of the plurality of further recesses.

In a further embodiment the recess or each recess of the plurality of recesses has a first depth, and the further recess or each recess of the plurality of further recesses has a second depth that is different from the first depth.

In a further embodiment the relief structure comprises at least one recess that does not penetrate the carrier and covers an area of the surface of the carrier that is confined by concentric circles or spirals.

The following is a detailed description of examples of the method and the carrier in conjunction with the accompanying drawings.

DETAILED DESCRIPTION

Figure 1:
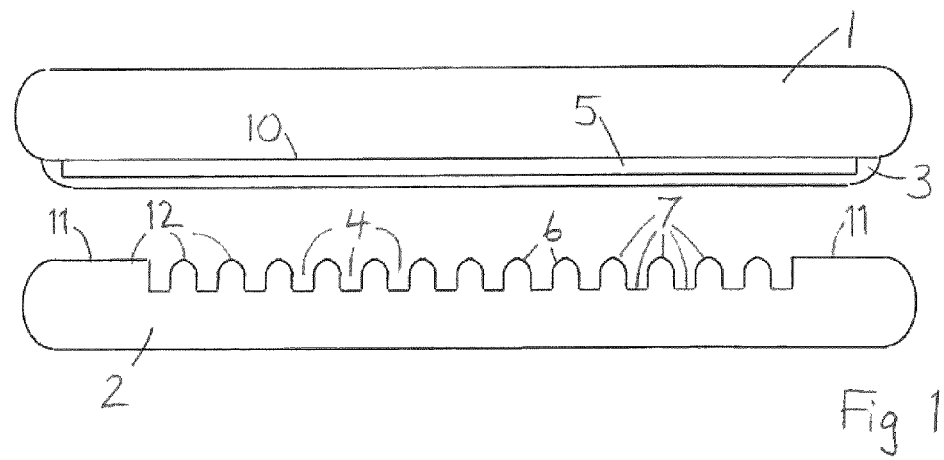
FIG. 1 shows a cross section of an arrangement of a wafer above an embodiment of the carrier.

FIG. 1 shows a cross section of an arrangement of a semiconductor wafer 1 above an embodiment of the carrier 2, which may be a further semiconductor wafer, for instance. The method is typically applied when the rear side of the wafer 1 is to be processed, especially if the wafer 1 is to be thinned by etching and/or grinding. In this case the surface of the wafer 1 that is to be mounted to the carrier is a front side, which may be provided with an integrated circuit like a CMOS circuit. This is indicated in FIG. 1 by a device layer 5 on the main surface 10 that is arranged opposite the carrier 2. The device layer 5 may comprise a wiring and intermetal dielectric, for instance. In the example shown in FIG. 1, the surface 10 of the wafer 1 is covered with an adhesive 3. The adhesive 3 may instead be applied to the carrier 2 or both to the wafer 1 and to the carrier 2.

The upper main surface 12 of the carrier 2 is provided with a relief structure 7, which may be formed by a recess or by a plurality of recesses 4, for instance. There can be any number and arrangement of recesses 4, which need not penetrate the carrier 2. The relief structure 7 reduces the area of the actual carrier surface that is located within the plane of the main upper surface 12. This means that, considering a unit area within this plane, the portion that is occupied by the actual carrier surface is reduced by the relief structure 7.

The margin 11 of the surface 12 can be free from the relief structure 7, so that the area of contact for fastening the wafer 1 is maintained in the margin 11 and decreased in the centre of the surface 12. Hence the adhesive strength will be lower in the centre than in the margin 11. The contact area may be further decreased if the relief structure 7 is provided with rounded edges 6, which may be formed by etching the recesses 4 partially anisotropically and partially isotropically, for example.

Figure 2:
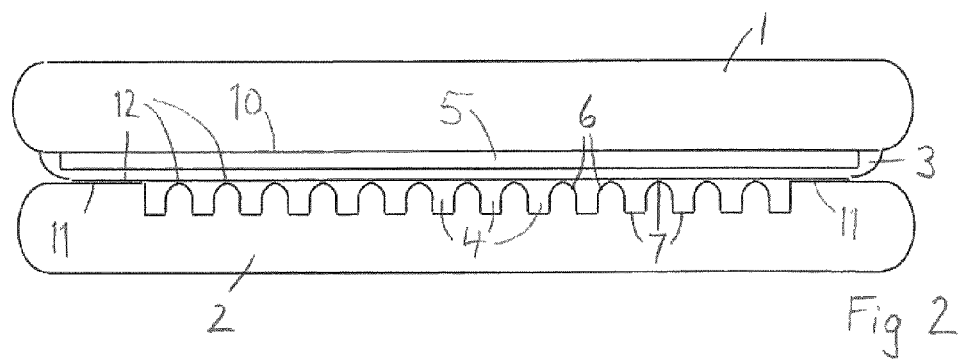
FIG. 2 shows a cross section according to FIG. 1 after the connection of the wafer and the carrier.

FIG. 2 shows a cross section according to FIG. 1 after the connection of the wafer 1 and the carrier 2, which are fastened to one another by the adhesive 3. The adhesive strength per unit area of the plane of the upper main carrier surface 12 is lower in the centre than at the margin 11. This difference is caused by the relief structure 7, which reduces the portion of the actual carrier surface that is located within the plane of the upper main surface 12 of the carrier 2 and is thus disposed to make the bonding contact for fastening the wafer 1.

If the adhesive 3 has been selected to tolerate high temperatures and to maintain the connection between the wafer 1 and the carrier 2 at temperatures of typically 300° C. or more, further process steps can be performed at temperatures well above 300° C. or even above 350° C. with the wafer 1 still connected to the carrier 2, because the relief structure 7 is not adversely affected by the high temperature. Furthermore, if the adhesive 3 is also selected to maintain its property of being removable even after having been exposed to elevated temperatures, it can subsequently be removed.

Figure 3:
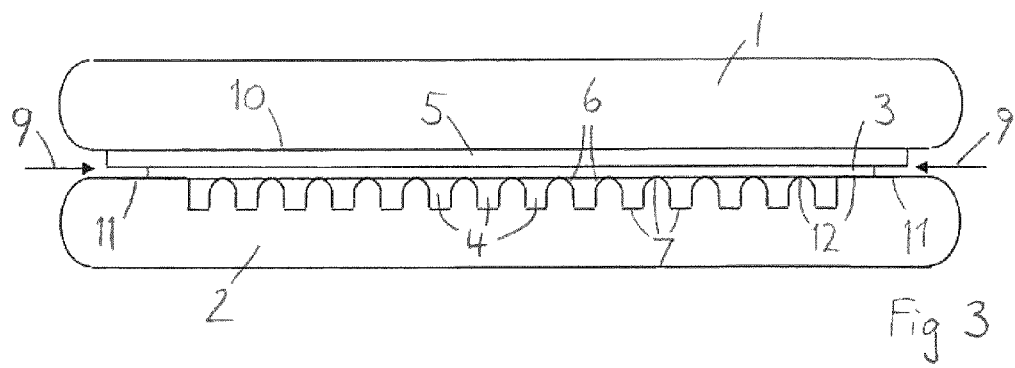
FIG. 3 shows a cross section according to FIG. 2 during a lateral etch attack or dissolution.

FIG. 3 shows a cross section according to FIG. 2 during a lateral etch attack or dissolution. A solvent is introduced in the interspace between the wafer 1 and the carrier 2, which can be performed in the lateral direction indicated by the arrows 9, in order to remove the adhesive 3 and thus to separate the wafer 1 from the carrier 2. The separation is facilitated by the reduced adhesive strength in the centre of the carrier 2, owing to the relief structure 7, which reduces the contact area. The adhesive 3 is easily removed from the margin 11, and the reduced bonding strength in the centre facilitates the separation of the wafer 1 from the carrier 2.

Figure 4:
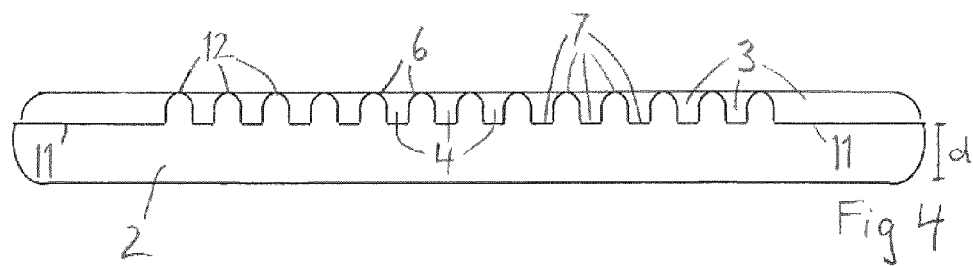
FIG. 4 shows a cross section of a further embodiment of the carrier.

FIG. 4 shows a cross section of a further embodiment of the carrier 2, in which the margin 11 of the carrier surface facing the wafer 1 is lower than the plane of the upper main surface 12 defined by the uppermost portions of the actual carrier surface. The margin 11 may be at the level of the bottoms of the recesses 4, for example. In the margin 11 the carrier 2 has a reduced thickness d. This structure of the carrier surface is appropriate if the adhesive 3 is to be confined to the recesses 4 and if it is not desired that the adhesive 3 covers an unstructured planar surface area at the level of the upper main surface 12, as it is the case in the margin 11 of the embodiment according to FIGS. 1 to 3.

Figure 5:
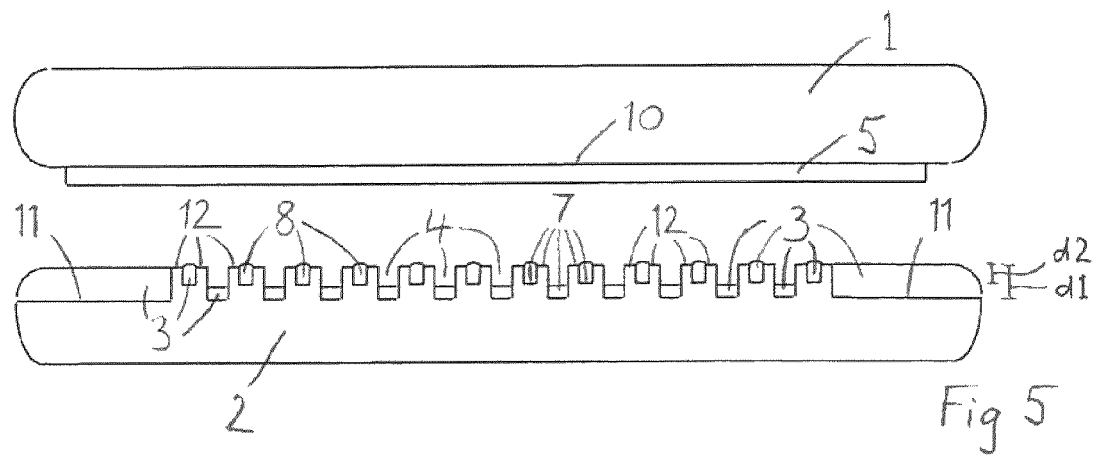
FIG. 5 shows a cross section of an arrangement of a wafer above a further embodiment of the carrier.

FIG. 5 shows a cross section of an arrangement of a wafer 1 above a further embodiment of the carrier 2. In this embodiment the relief structure 7 comprises recesses 4 of a first depth d1 and further recesses 8 of a smaller second depth d2, which may yield a smaller volume of the further recesses 8. The further recesses 8 may be filled with the adhesive 3, while the deeper recesses 4 may not be filled. The top level of the adhesive 3 may exceed the level of the plane of the upper main surface 12 at least slightly, so that the adhesive 3 comes into contact with the wafer 1 when the wafer 1 is mounted on the carrier 2. The deeper recesses 4 may serve to accommodate amounts of the adhesive 3 that may initially be present on the upper main surface 12 of the carrier 2 and are squeezed into the recesses 4 when the wafer 1 is mounted. If no adhesive 3 is present between the wafer 1 and the upper main surface 12 of the carrier 2, the bond will be limited to areas outside the upper main surface 12.

The margin 11 of the carrier surface can be at the level of the plane of the upper main surface 12 or at a lower level, especially at the level of the bottoms of the deeper recesses 4, for example, as shown in FIG. 5. In the first case, if the margin 11 is not lower than the plane of the surface 12, the adhesive 3 can completely be confined to the recesses 4 and further recesses 8, and the bonding effect will be limited to the relatively small contact areas occupied by the further recesses 8.

Figure 6:
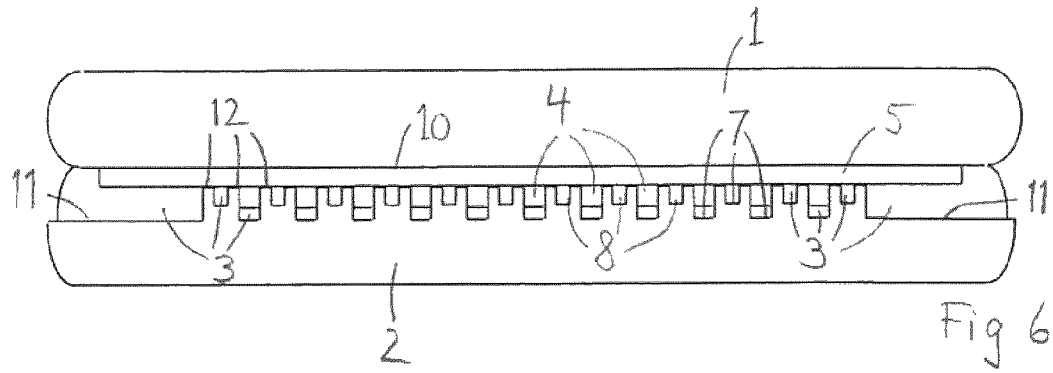
FIG. 6 shows a cross section according to FIG. 5 after the connection of the wafer and the carrier.

FIG. 6 shows a cross section according to FIG. 5 after the connection of the wafer 1 and the carrier 2. There is no adhesive 3 between the wafer 1 and the upper main surface 12 of the carrier 2. A relatively strong adhesion may be provided in the margin 11, if the margin 11 is lower than the plane of the upper main surface 12 of the carrier 2 and the adhesive 3 occupies the empty space between the margin 11 and the wafer 1, as it is the case in the embodiment according to FIGS. 5 and 6. Otherwise the adhesion may be limited to the central region of the carrier and may only be effected by the adhesive 3 that is present in the further recesses 8.

Figure 7:
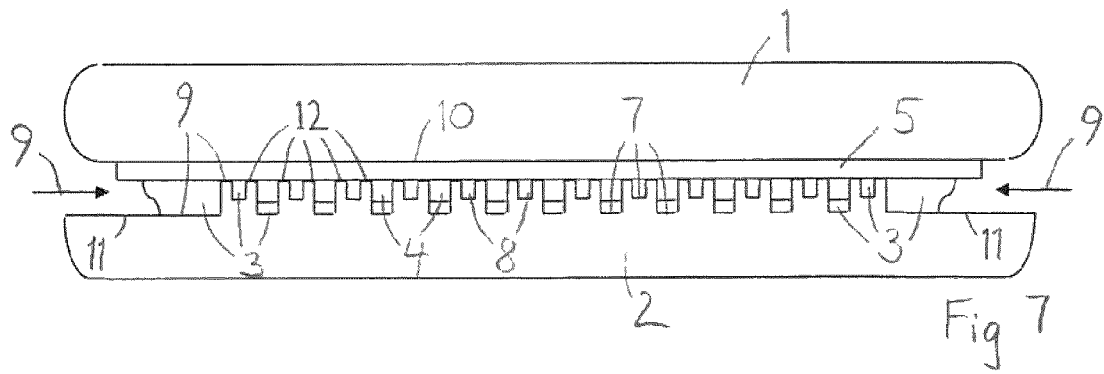
FIG. 7 shows a cross section according to FIG. 6 during a lateral etch attack or dissolution.

FIG. 7 shows a cross section according to FIG. 6 during a lateral etch attack or dissolution. A solvent is introduced in the interspace between the wafer 1 and the carrier 2, which can be performed in the lateral direction indicated by the arrows 9, in order to remove the adhesive 3 and thus to separate the wafer 1 from the carrier 2. The separation is facilitated by the reduced adhesive strength in the centre of the carrier 2, owing to the relief structure 7, which reduces the contact area. The adhesive 3 is easily removed from the margin 11, and the reduced bonding strength in the centre facilitates the separation of the wafer 1 from the carrier 2.

FIGS. 8 to 12 are schematic plan views of embodiments of the carrier 2 showing the shape of the recesses 4 or further recesses 8 within the carrier surface 12. In the embodiment according to FIG. 8 the recesses 4 and/or the further recesses 8 are arranged in concentric circles at a distance from one another. The margin 11 is free from the recesses 4 and/or the further recesses 8. The breadth of the margin 11 can be adapted to the requirements of the individual embodiments. A recess 4 and/or a further recess 8 may instead be arranged following a spiral or concentric spirals having the same centre and being rotated with respect to one another. The patterned recesses 4, 8 can be produced by circle cutting, lithography or laser ablation etc. The adhesive 3 may be deposited into the recesses 4 or further recesses 8, respectively, by a micro dispense system, for example.

Figure 8:
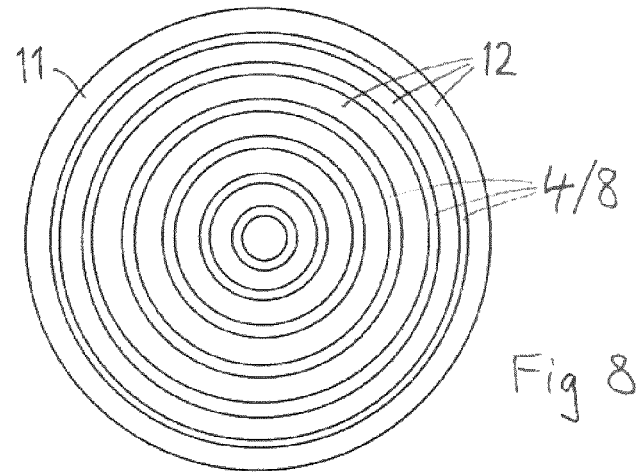
FIG. 8 shows a schematic plan view of an embodiment of the carrier.
Figure 9:
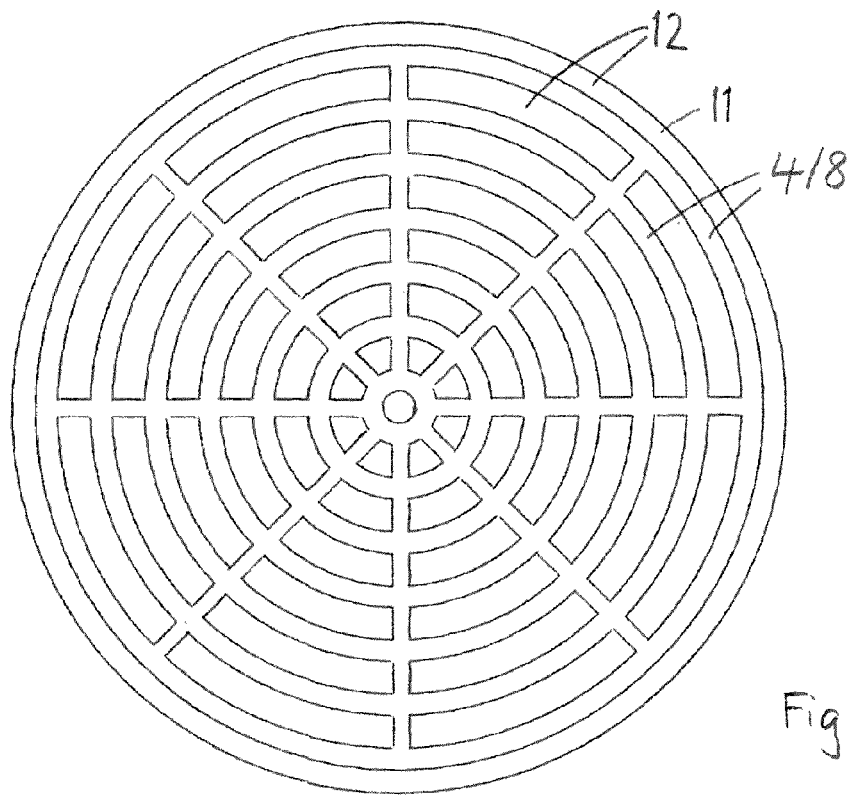
FIG. 9 shows a schematic plan view of a further embodiment of the carrier.

The embodiment according to FIG. 9 comprises recesses 4 and/or further recesses 8 arranged in concentric circles at a distance from one another, similar to the embodiment according to FIG. 8, with additional radial connections. The percentage of the carrier surface 12 that is occupied by the area of the recesses 4 and/or further recesses 8 is thus increased towards the centre of the carrier surface 12.

Figure 10:
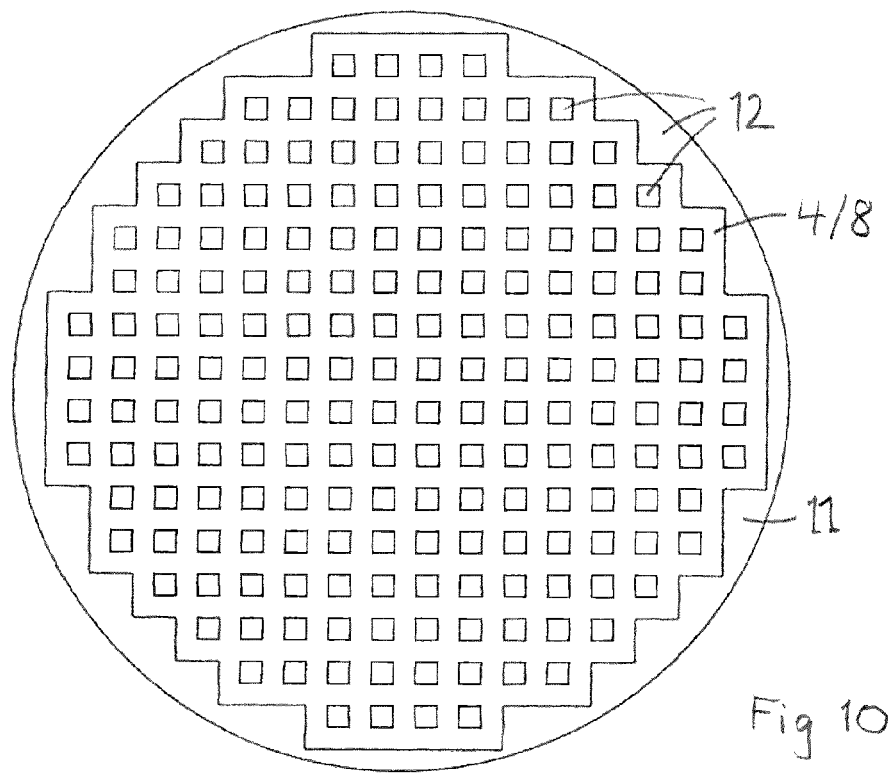
FIG. 10 shows a schematic plan view of a further embodiment of the carrier.

The embodiment according to FIG. 10 comprises recesses 4 and/or further recesses 8 arranged as a double lattice of parallel trenches. In the embodiments according to FIGS. 9 and 10 the recesses 4 and/or further recesses 8 are completely connected to form one structured recess 4 or further recess 8, respectively. This structure may be favourable in view of the disposition of surplus adhesive.

Figure 11:
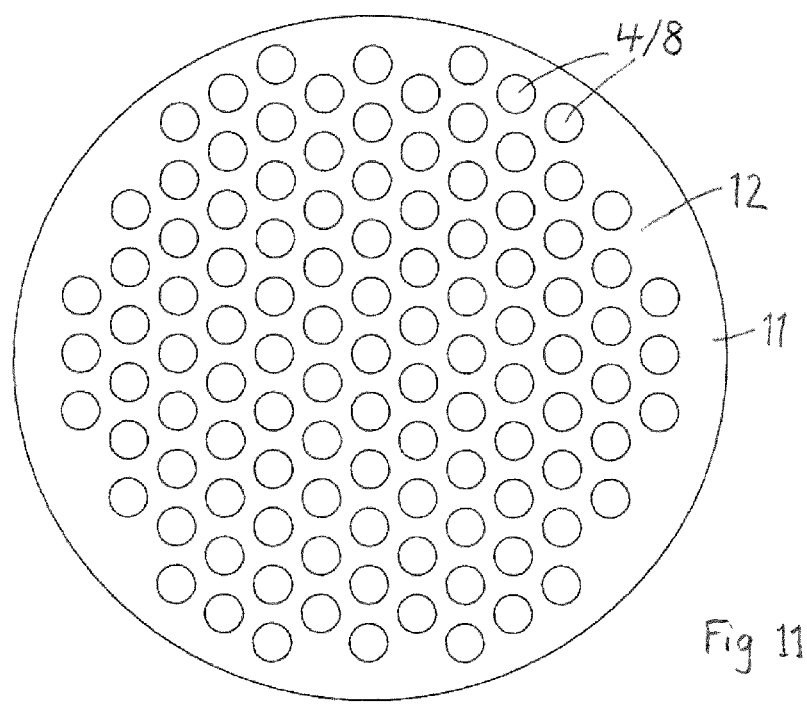
FIG. 11 shows a schematic plan view of a further embodiment of the carrier.

The embodiment according to FIG. 11 comprises recesses 4 and/or further recesses 8 in the shape of cylindrical openings distributed all over the carrier surface 12. This embodiment may be favorable in view of an easy manufacture.

Figure 12:
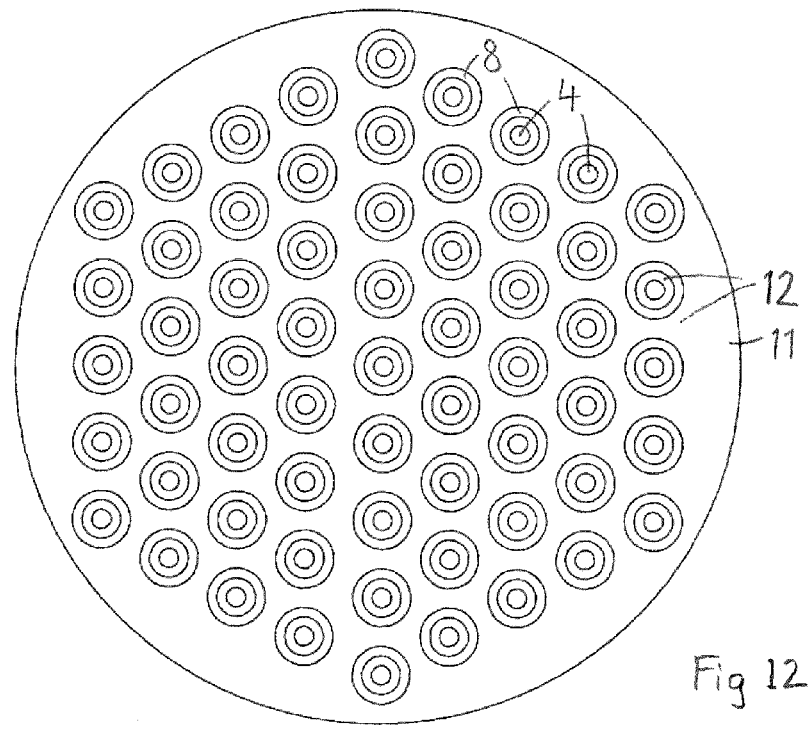
FIG. 12 shows a schematic plan view of a further embodiment of the carrier.

The embodiment according to FIG. 12 also comprises recesses 4 in the shape of cylindrical openings distributed all over the carrier surface 12. The recesses 4 are surrounded by further recesses 8 in the shape of circular trenches arranged concentrically with the recesses 4.

The pattern of the recesses 4, 8 is not restricted to these examples, but any pattern based on any geometrical shapes may be suitable in order to decrease the contact area of the bonding interface and thereby to reduce the strength of the adhesive bond. The carrier 2 can comprise various materials, in particular a semiconductor material like silicon, germanium, silicon carbide or gallium arsenide, for example, a glass like quartz glass or sapphire, for example, or a metal like WCu or MoCu, for example.

The invention claimed is:

1. A method of producing a removable wafer connection, comprising:
    providing a wafer and a carrier having a surface provided for accommodating the wafer;
    fastening the wafer to the carrier by a removable adhesive contacting the carrier; and
    providing the surface of the carrier with a relief structure, before the adhesive is brought into contact with the surface of the carrier, the relief structure reducing the strength of adhesion between the wafer and the carrier,
    wherein the relief structure is formed by a recess or a plurality of recesses in the surface of the carrier,
    wherein the relief structure comprises a further recess or a plurality of further recesses in the surface of the carrier,
    wherein the recess or each recess of the plurality of recesses having a larger volume than the further recess or any further recess of the plurality of further recesses,
    wherein the recess or each recess of the plurality of recesses has a first depth, and the further recess or each recess of the plurality of further recesses has a second depth that is different from the first depth,
    wherein the recess or the plurality of recesses and the further recess or the plurality of further recesses do not penetrate the carrier, and
    wherein only the further recess or each recess of the plurality of further recesses is completely filled with the adhesive.

2. The method according to claim 1, wherein a margin of the surface of the carrier is kept free from the relief structure.

3. The method according to claim 1, wherein the relief structure is formed by at least one recess that is confined in a plane of the surface of the carrier by concentric circles or spirals.

4. The method according to claim 1, further comprising:
    selecting the adhesive to provide a stable connection between the wafer and the carrier at a temperature of at least 300° C. and to be removable after having been exposed to this temperature;
    performing at least one further process step at this temperature or reaching this temperature while the wafer is connected to the carrier; and
    subsequently removing the adhesive by introducing a solvent between the wafer and the carrier.

* * * * *